(12) United States Patent
Chen

(10) Patent No.: US 7,851,253 B2
(45) Date of Patent: Dec. 14, 2010

(54) PHASE CHANGE MEMORY DEVICE AND FABRICATING METHOD

(75) Inventor: Wei-Su Chen, Hsinchu (TW)

(73) Assignee: Promos Technologies Inc., Hsinchu (TW)

( * ) Notice: Subject to any disclaimer, the term of this patent is extended or adjusted under 35 U.S.C. 154(b) by 160 days.

(21) Appl. No.: 12/292,508

(22) Filed: Nov. 20, 2008

(65) Prior Publication Data

US 2009/0081825 A1  Mar. 26, 2009

Related U.S. Application Data

(62) Division of application No. 11/797,730, filed on May 7, 2007, now Pat. No. 7,732,801.

(30) Foreign Application Priority Data

Jan. 10, 2007  (TW) ............................... 96100903 A

(51) Int. Cl.
*H01L 45/00* (2006.01)

(52) U.S. Cl. .................. 438/102; 438/95; 438/103; 257/2; 257/3; 257/4; 257/5

(58) Field of Classification Search .................. 438/95, 438/102, 103; 257/2–5
See application file for complete search history.

(56) References Cited

U.S. PATENT DOCUMENTS 6,501,111 B1  12/2002  Lowrey

2004/0197947 A1 *  10/2004  Fricke et al. ................. 438/102
2005/0093022 A1 *  5/2005  Lung ........................... 257/200
2007/0152205 A1 *  7/2007  Chen .............................. 257/4

FOREIGN PATENT DOCUMENTS

EP  1339111 A1  2/2002

* cited by examiner

*Primary Examiner*—David Vu
*Assistant Examiner*—Suberr Chi
(74) *Attorney, Agent, or Firm*—Birch, Stewart, Kolasch & Birch, LLP

(57) ABSTRACT

A phase change memory device is provided. The phase change memory device includes a substrate with a first electrode layer formed thereon. A first phase change memory structure is on the first electrode layer and electrically connected to the first electrode layer. A second phase change memory structure is on the first phase change memory structure and electrically connected to the first phase change memory structure, wherein the first or second phase change memory structure includes a cup-shaped heating electrode. A first insulating layer covers a portion of the cup-shaped heating electrode along a first direction. A first electrode structure covers a portion of the first insulating layer and the cup-shaped heating electrode along a second direction. The first electrode structure includes a pair of phase change material sidewalls on a pair of sidewalls of the first electrode structure and covering a portion of the cup-shaped heating electrode.

6 Claims, 15 Drawing Sheets

US 7,851,253 B2

PHASE CHANGE MEMORY DEVICE AND FABRICATING METHOD

CROSS REFERENCE TO RELATED APPLICATIONS

This application is a Divisional of application Ser. No. 11/797,730 filed on May 7, 2007, now U.S Pat. No. 7,732,801 and for which priority is claimed under 35 U.S.C. §120; and this application claims priority of Application No. TW 96100903 filed in Taiwan on Jan. 10, 2007 under 35 U.S.C. §119; the entire contents of all are hereby incorporated by reference.

BACKGROUND OF THE INVENTION

1. Field of the Invention

The invention relates to a phase change memory device and method for fabricating the same, and more particularly to a phase change memory device with relatively higher device density and a method for fabricating the same.

2. Description of the Related Art

A phase change memory (PCM) device may potentially serve as a 64-megabyte (MB) or greater stand-alone non-volatile memory. Before PCM devices become a mainstream replacement for flash memory, however, they must first achieve excellent electrical and thermal performance. Fabrication of non-volatile memory with relatively higher device density using the conventional fabricating process is, thus, a major aim of researchers.

U.S. Pat. No. 6,501,111 issued by Intel Corporation discloses a conventional three-dimensional PCM (3D-PCM) 212 with a cup-shaped bottom electrode 206 as shown in FIG. 1a. A contact area between a phase change material 207 and a bottom electrode can serve as a contact area between the phase change material 207 and a width of the cup-shaped bottom electrode 206, thus, device density can be improved. A bottleneck occurs when minimizing the device area however in a conventional fabrication process, thus, such a process is unsuitable for a photolithography process with a critical dimension (CD) below 0.1 μm. EP Pat. No. 1339111 issued by ST Microelectronics (STM) Corporation discloses a PCM formed by filling a phase change material into a contact hole 57 with a nano-level CD or a minitrench 58 to reduce the contact area 58 between the phase change material and a cup-shaped heating electrode 22, thus, higher device density can be achieved. If the CD of the contact hole is too small to be filled with phase change material, however, a seam problem occurs.

A PCM device with a higher device density and not limited by photolithography resolution is desirable.

BRIEF SUMMARY OF INVENTION

A detailed description is given in the following embodiments with reference to the accompanying drawings.

The invention provides a phase change memory device and method for fabricating the same. An exemplary embodiment of a phase change memory device comprises a substrate. A first electrode layer is formed on the substrate. A first phase change memory structure is formed on the first electrode layer and electrically connected to the first electrode layer. A second phase change memory structure is formed on the first phase change memory structure and electrically connected to the first phase change memory structure. The first phase change memory structure or the second phase change memory structure comprises a cup-shaped heating electrode disposed in a first dielectric layer. A first insulating layer is disposed on the first dielectric layer along a first direction covering a portion of the cup-shaped heating electrode. A second dielectric layer is disposed on the first insulating layer and the first dielectric layer. A first electrode structure is disposed in the second dielectric layer along a second direction and covering a portion of the first insulating layer and the cup-shaped heating electrode. The first electrode structure comprises a pair of phase change material spacers disposed on a pair of sidewalls of the first electrode structure covering a portion of the cup-shaped heating electrode.

A method of fabricating a phase change memory device comprises providing a substrate with a first electrode structure formed thereon. A first phase change memory structure is formed on the first electrode and electrically connected to the first electrode. A second phase change memory structure is formed on the first phase change memory structure and electrically connected to the first phase change memory structure. The first phase change memory structure or the second phase change memory structure comprises forming a cup-shaped heating electrode in a first dielectric layer. A first insulating layer is formed on the first dielectric layer along a first direction covering a portion of the cup-shaped heating electrode. A first electrode structure is formed along a second direction covering a portion of the first insulating layer and the cup-shaped heating electrode. The first electrode structure comprises a pair of phase change material spacers disposed on a pair of sidewalls of the electrode structure and covering a portion of the cup-shaped heating electrode. A second dielectric layer is formed on the first insulating layer and the first dielectric layer and adjacent the first electrode structure.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
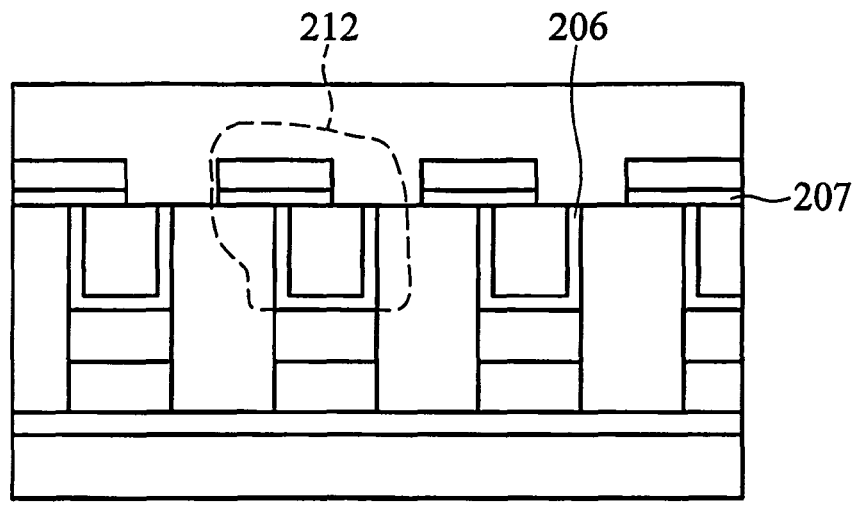
FIGS. 1a and 1b show conventional phase change memory devices.
Figure 1B:
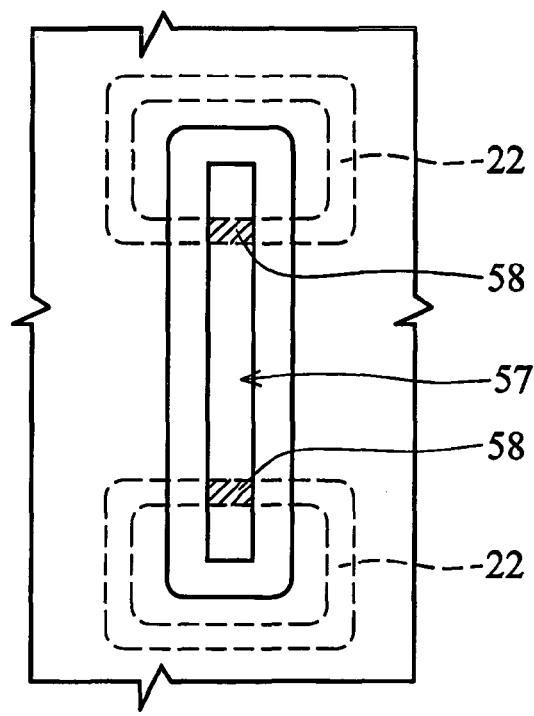
Figure 2A:
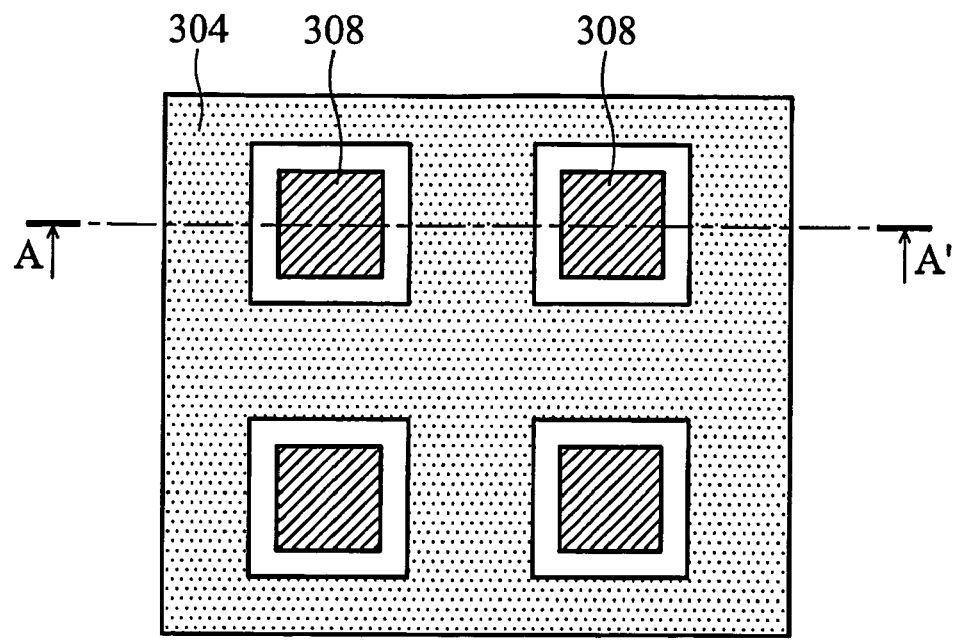
FIGS. 2a, 3a, 4a, 5a, 6a, 7a and 8a show top views of an exemplary embodiment of a 2-dimensional phase change memory device.
Figure 2B:
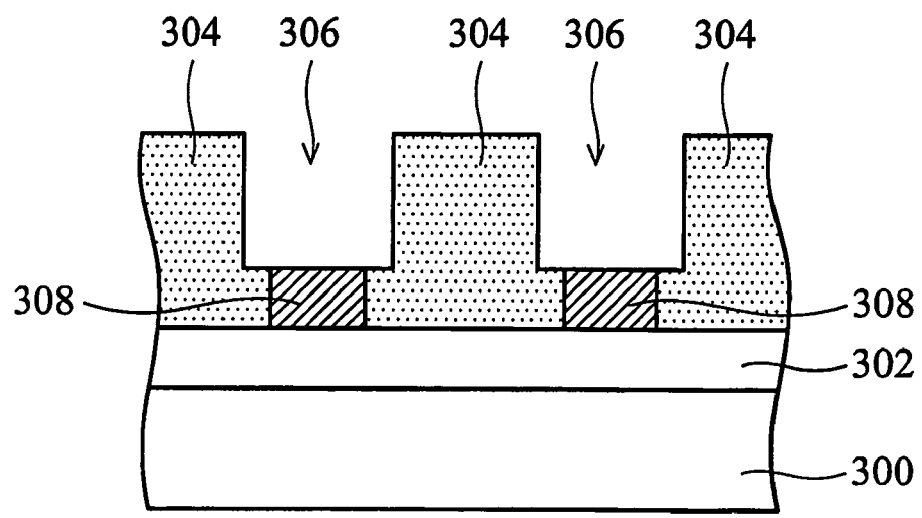
FIGS. 2b, 3b, 4b, 5b, 6b, 7b and 8b show cross sections taken along line A-A' of FIGS. 2a, 3a, 4a, 5a, 6a, 7a and 8a, respectively.
Figure 3A:
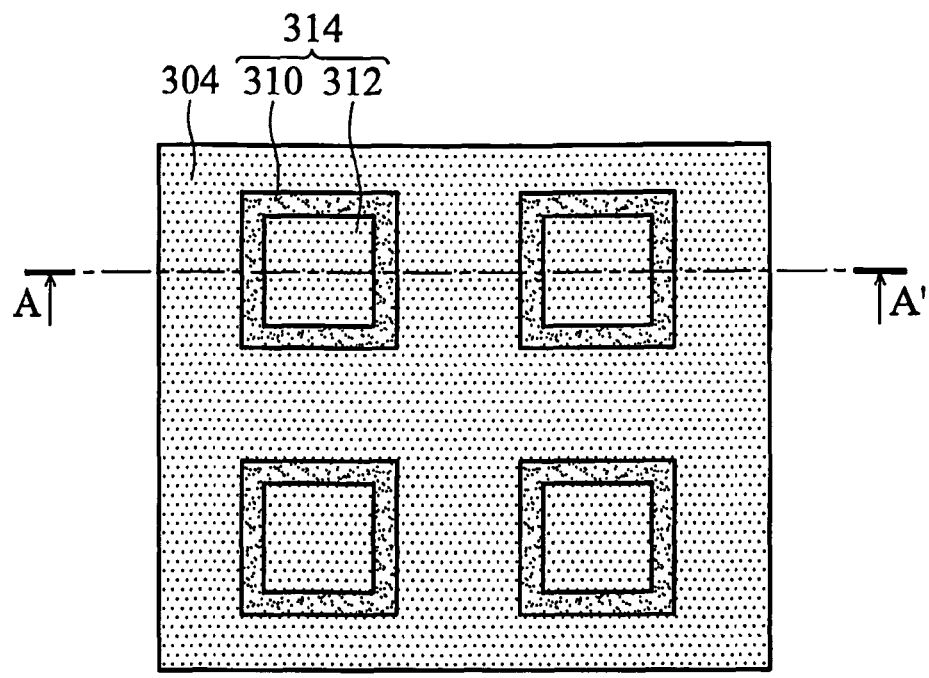
Figure 3B:
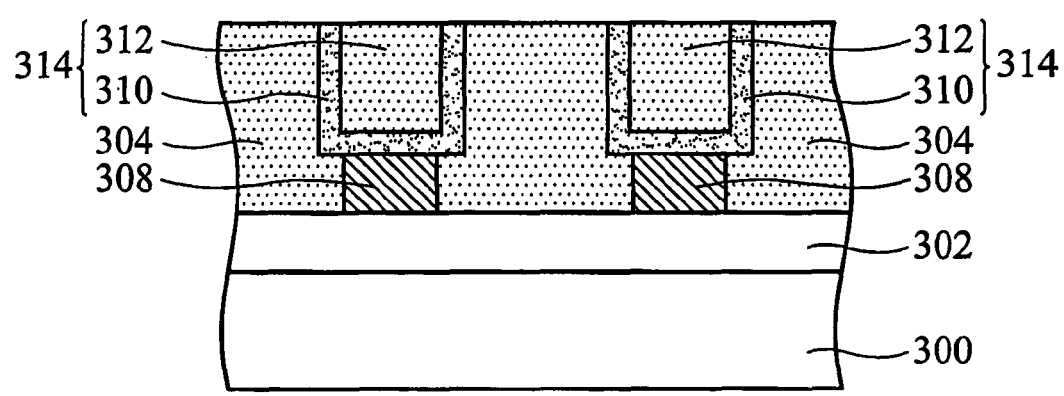
Figure 4A:
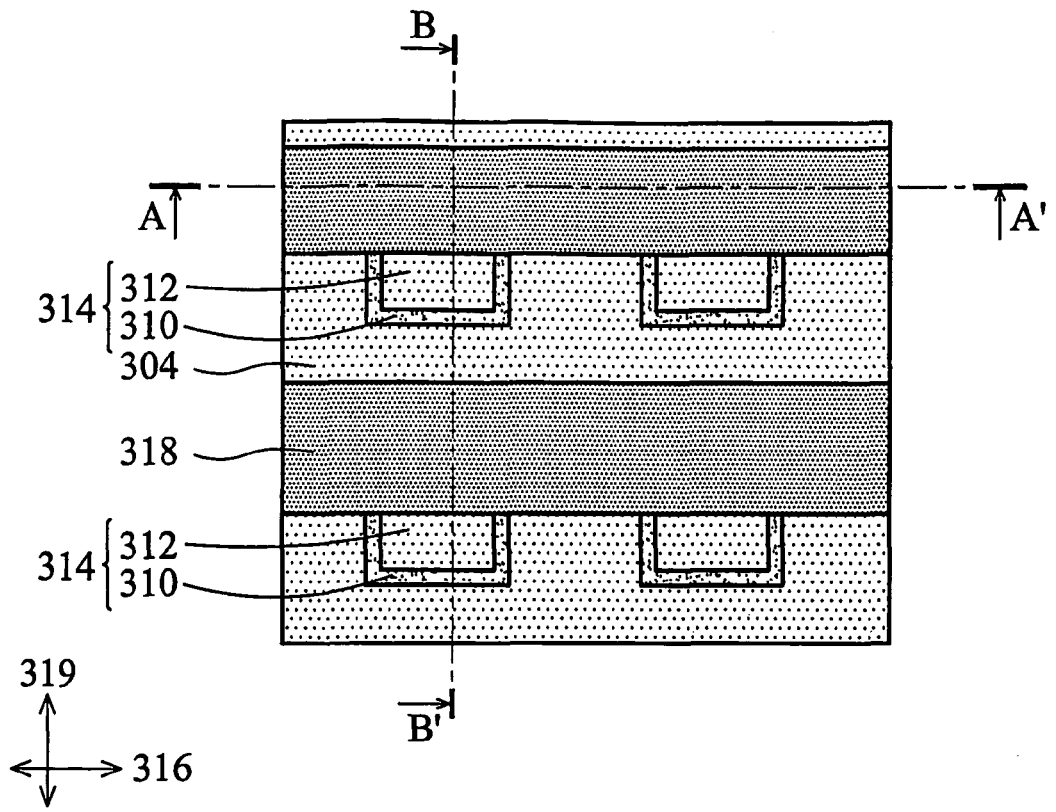
Figure 7A:
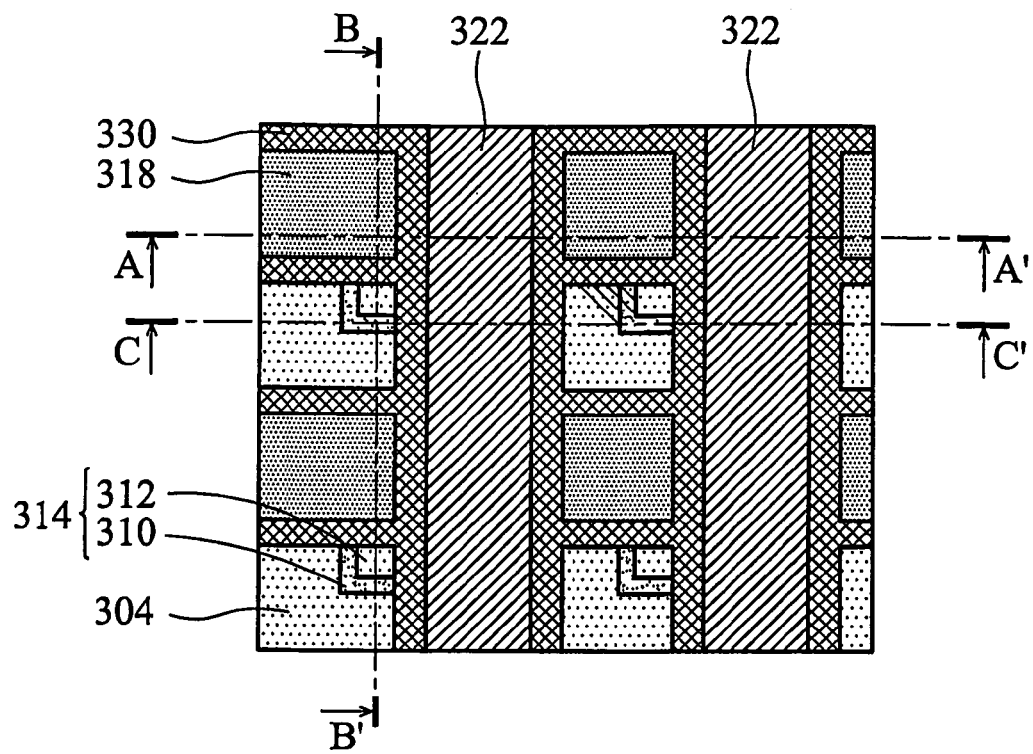
Figure 7B:
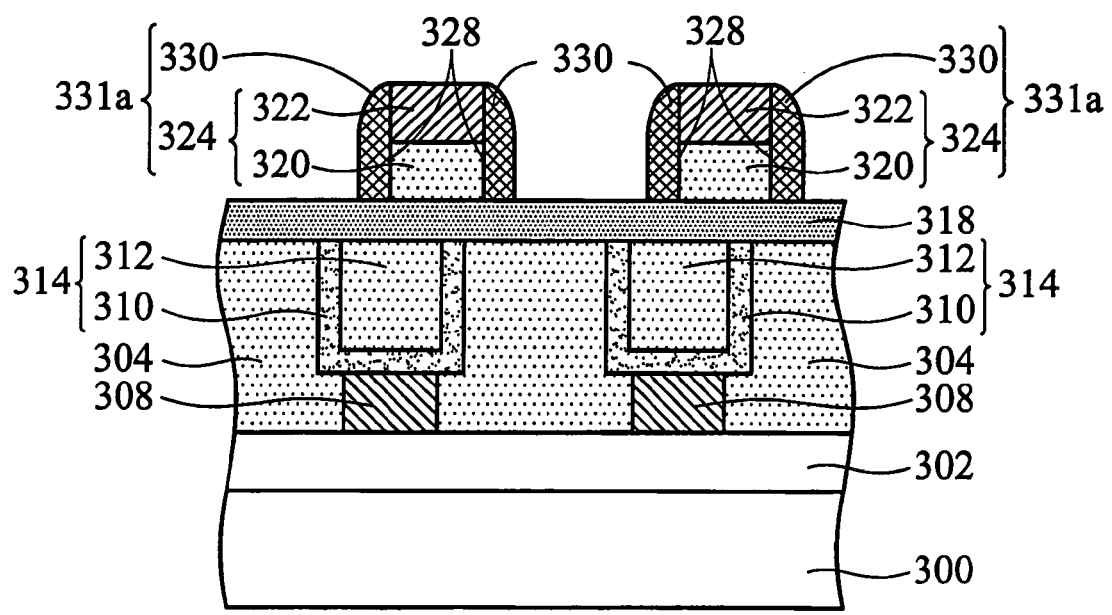
Figure 7C:
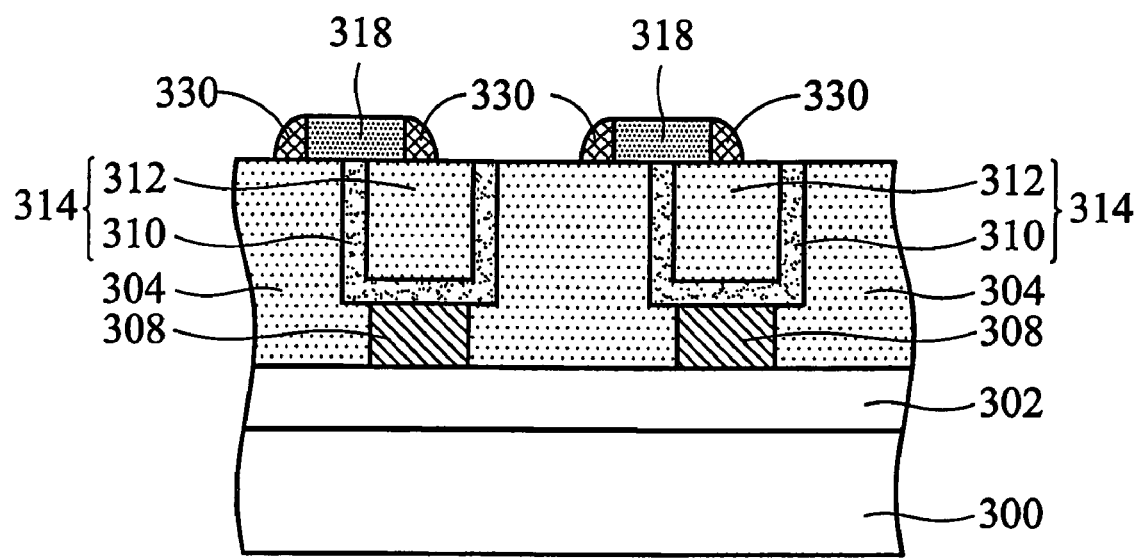
Figure 7D:
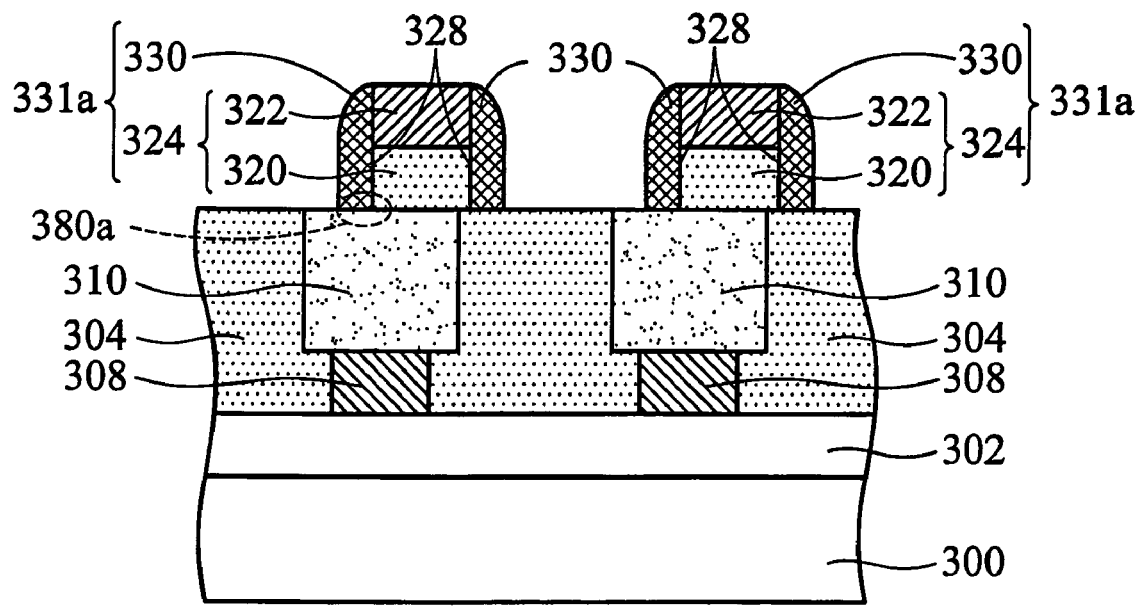
FIGS. 7d and 8d show cross sections taken along line C-C' of FIGS. 7a and 8a, respectively.
Figure 7E:
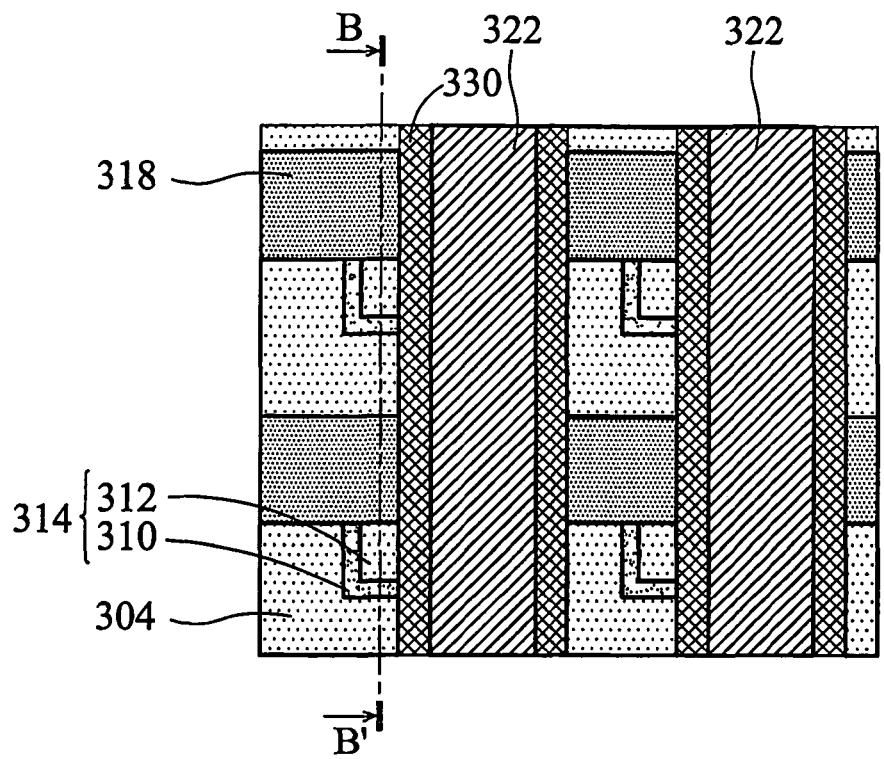
FIG. 7e shows a top view of another exemplary embodiment of a phase change memory device.
Figure 7F:
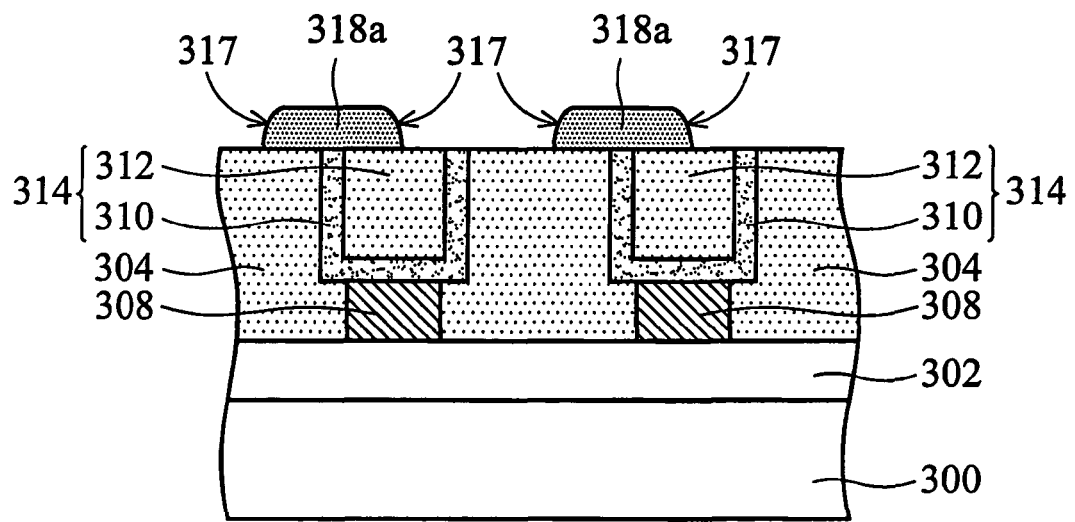
FIG. 7f shows a cross section taken along line A-A' of FIG. 7e.
Figure 8A:
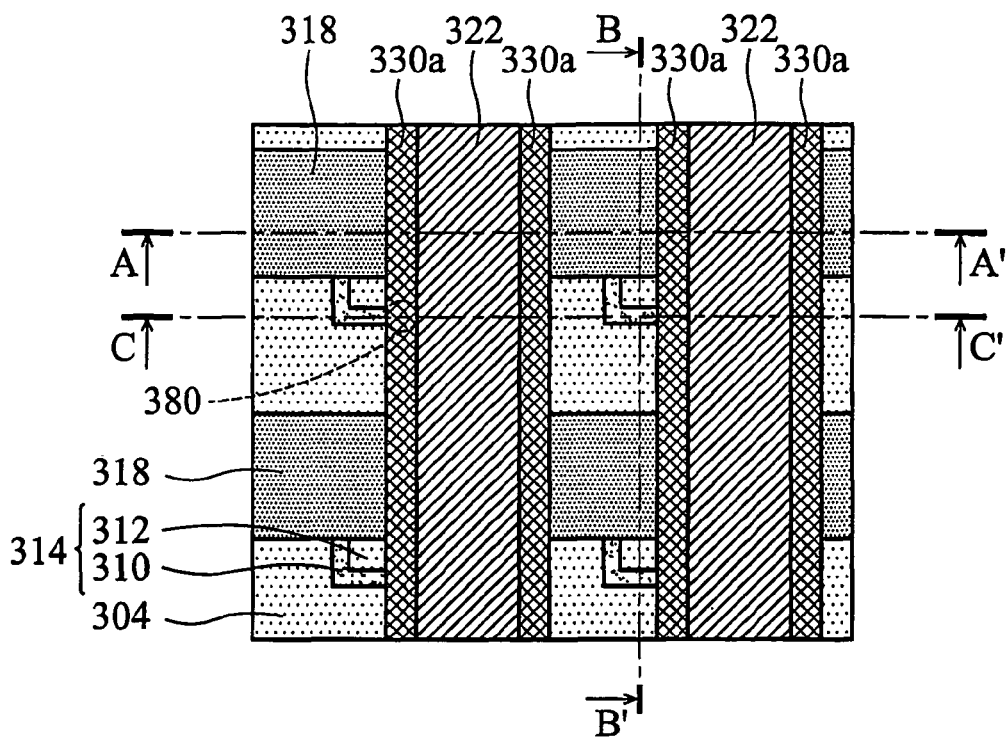
Figure 8B:
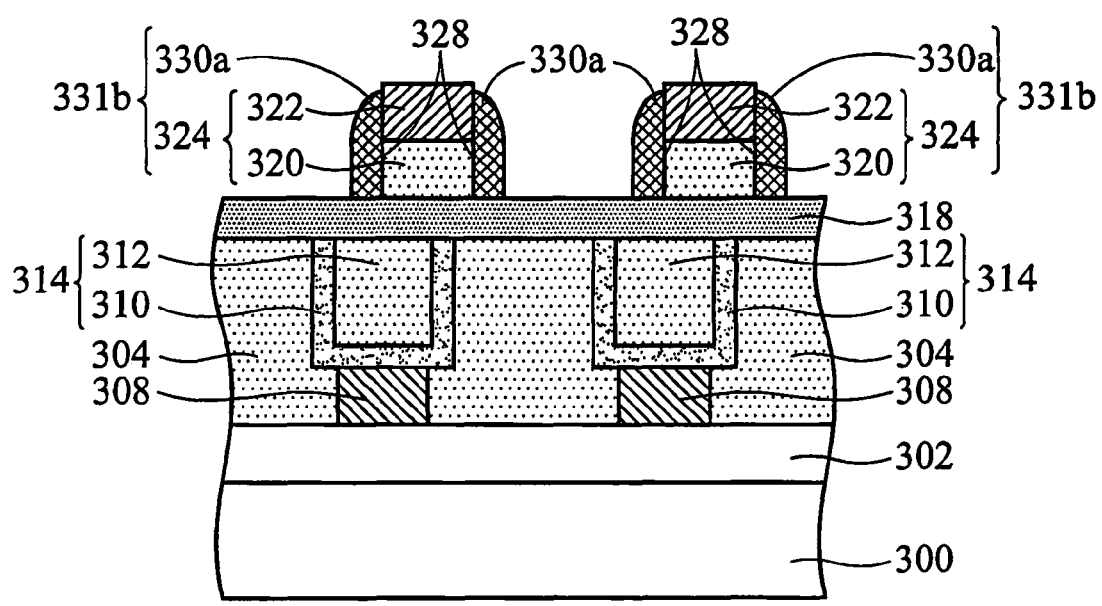
Figure 8C:
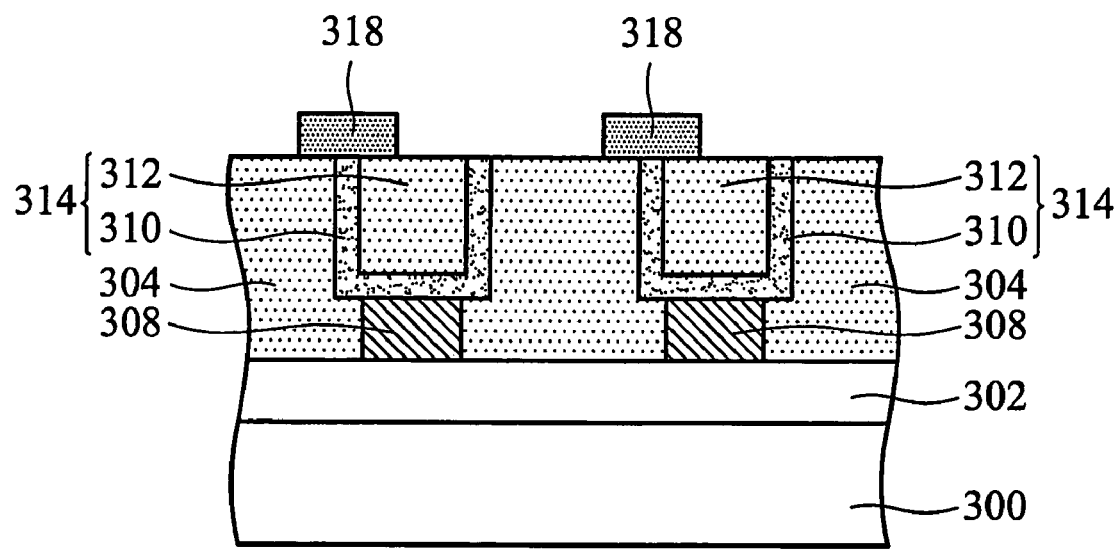
Figure 8D:
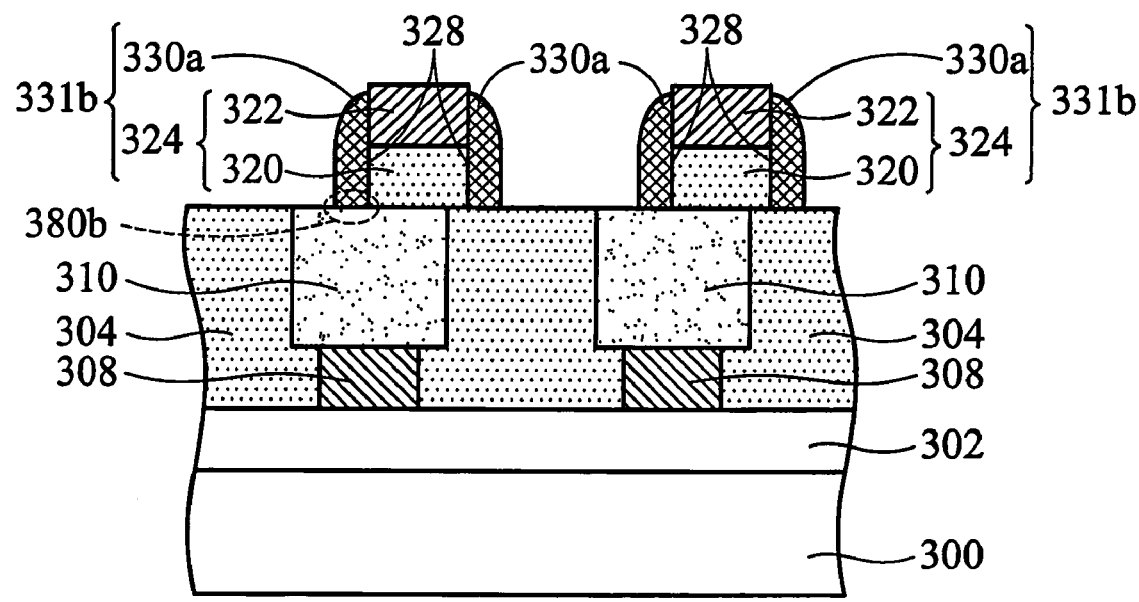
Figure 9:
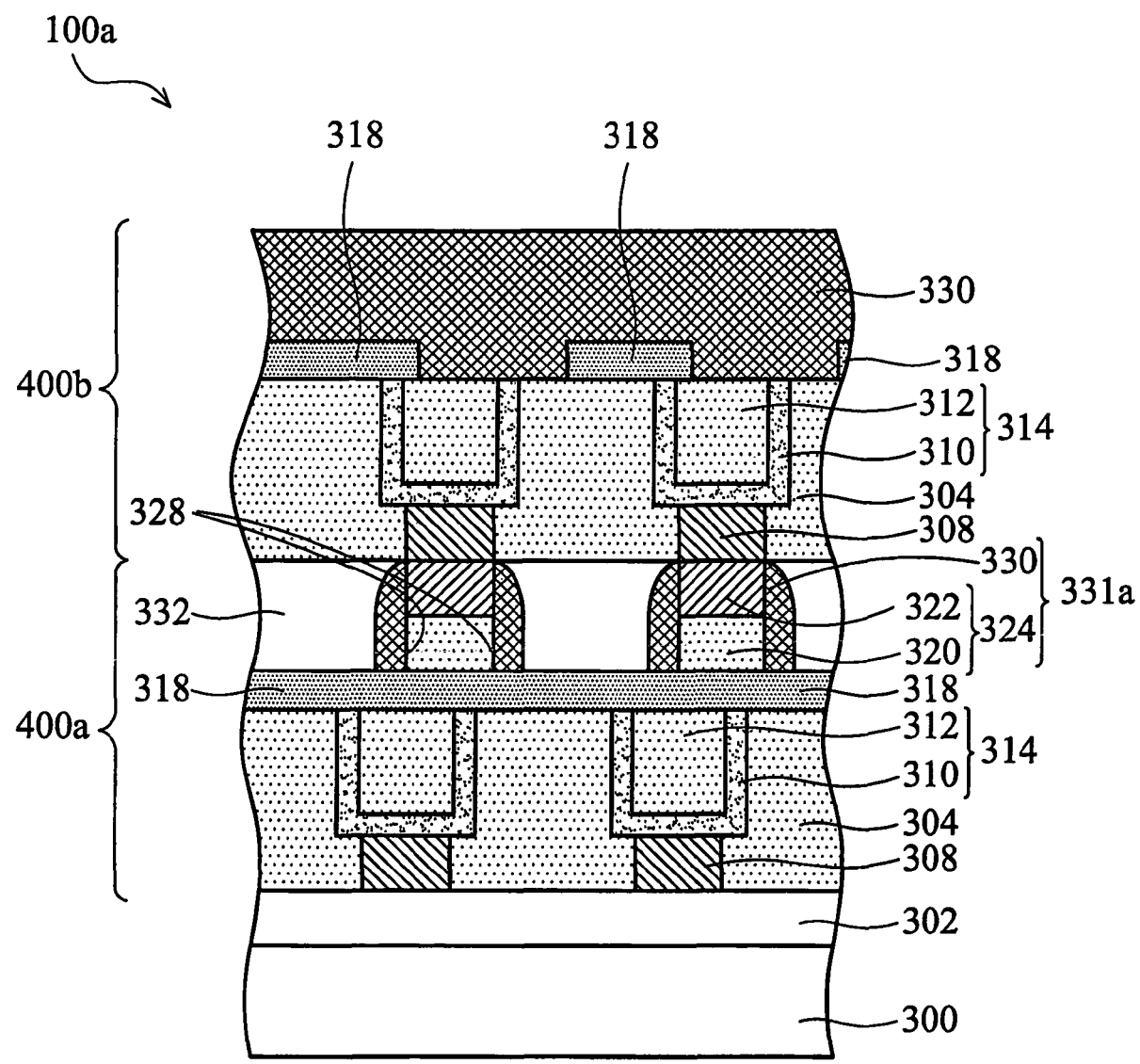
FIG. 9 shows a cross section of an exemplary embodiment of a 3-dimensional phase change memory device.
Figure 10:
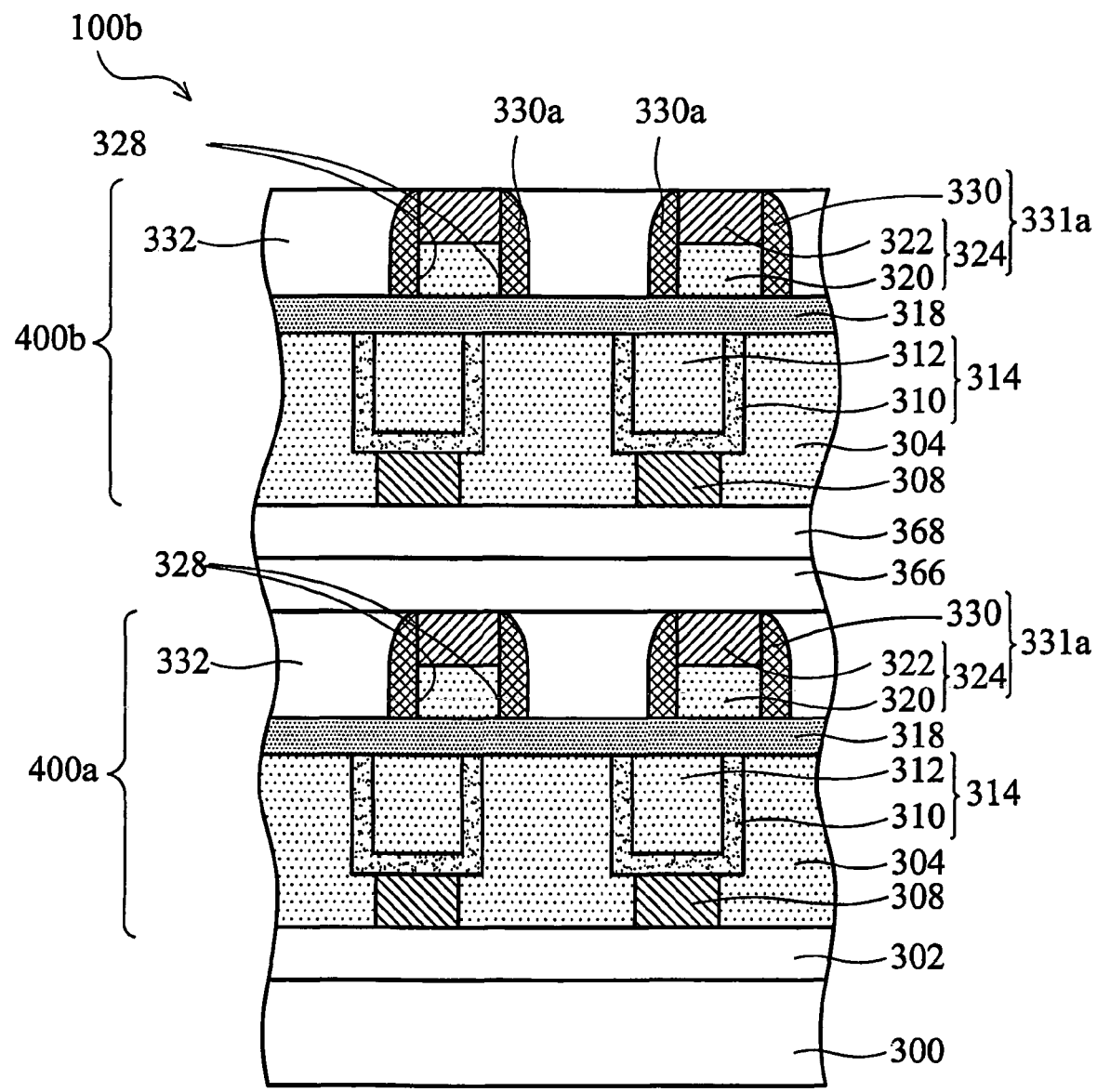
FIG. 10 shows a cross section of another exemplary embodiment of a 3-dimensional phase change memory device.

FIGS. 2a, 3a, 4a, 5a, 6a, 7a and 8a show top views of an exemplary embodiment of a 2-dimensional phase change memory device of the invention. For convenience, top views of four phase change memory devices are shown. FIGS. 2b, 3b, 4b, 5b, 6b, 7b and 8b are cross sections taken along line A-A' of FIGS. 2a, 3a, 4a, 5a, 6a, 7a and 8a, respectively. FIGS. 4c, 6c, 7c and 8c are cross sections taken along line B-B' of FIGS. 4a, 6a, 7a and 8a, respectively. FIG. 4d is a cross section taken along line B-B' of FIG. 4a showing another exemplary embodiment of a 2-dimensional phase change memory device. FIGS. 7d and 8d are cross sections taken along line C-C' of FIGS. 7a and 8a, respectively. FIG. 7e shows a top view of another exemplary embodiment of a phase change memory device of the invention. FIG. 7f is a cross section taken along line A-A' of FIGS. 7e. FIG. 9 is a cross section showing an exemplary embodiment of a 3-dimensional phase change memory device of the invention. FIG. 10 is a cross section showing another exemplary embodiment of a 3-dimensional phase change memory device of the invention. Wherever possible, the same reference numbers are used in the drawings and the descriptions of the same or like parts.

FIG. 2a illustrates a top view of an exemplary embodiment of a 2-dimensional phase change memory device 100. FIG. 2b shows a cross section of the 2-dimensional phase change memory device 100 taken along line A-A' of FIG. 2a. A substrate 300 is provided. The substrate 300 may comprise silicon. In alternative embodiments, SiGe, bulk semiconductor, strained semiconductor, compound semiconductor, silicon on insulator (SOI), and other commonly used semiconductor substrates can be used for the substrate 300. Next, a first electrode layer 302, serving as bottom electrode layer 302, is formed on the substrate 300 by a deposition process, such as, physical vapor deposition (PVD), sputtering, low pressure chemical vapor deposition (LPCVD), atomic layer chemical vapor deposition (ALD) or electroless plating. The first electrode layer 302 may comprise polysilicon, amorphous silicon, metal nitride or metal silicide. The first electrode layer 302 may also comprise metals or alloys. The first electrode layer 302 may also comprise cobalt (Co), tantalum (Ta), nickel (Ni), titanium (Ti), tungsten (W), TiW, other refractory metals, composite metals or basic metals such as aluminum (Al) or copper (Cu). The first electrode layer 302 may be a single layer or a composite layer, for example, Al layer, Cu/TaN layer or other single metal layer or composite metal layer.

Next, a p-type semiconductor layer and an n-type semiconductor layer (not shown) are formed on the first electrode layer 302 by thin film deposition such as CVD. A portion of the p-type semiconductor layer and an n-type semiconductor are then removed to form a diode 308 by photolithography and etching processes. The diode 308 may be a semiconductor composite layer, preferably a stack of an n-type impurity doped semiconductor layer and a p-type impurity doped semiconductor layer to form a p-n junction. The n-type impurity may comprise phosphorous (P) or arsenic (As), and the p-type impurity may comprise boron (B) or difluoroborane ($BF_2$). Alternatively, the diode 308 may comprise polycrystalline semiconductor materials or amorphous semiconductor materials such as polysilicon or amorphous silicon.

Next, a first dielectric layer 304 is formed on the first electrode layer 302 and the diode 308 as the diode 308 is covered by thin film deposition such as CVD. The first dielectric layer 304 may comprise silicon dioxide ($SiO_2$), silicon nitride ($SiN_X$) or the like. The first dielectric layer 304 is then covered with a patterned photoresist to define the position of a cup-shaped opening 306, and subsequent anisotropic etching to remove the first dielectric layer not covered by the patterned photoresist until the diode 308 is exposed. Next, the patterned photoresist is removed to form a cup-shaped opening 306. The bottom of the cup-shaped opening 306 is directly on top of the diode 308. An aperture of the cup-shaped opening 306 is related to a thickness of subsequently formed phase change material spacers. In one embodiment, the aperture of the cup-shaped opening 306 is preferably about 0.2 μm.

Referring to FIGS. 3a and 3b, a conductive layer 310 is formed on the first dielectric layer 304 and sidewalls of the cup-shaped opening 306 and covering the diode 308 by a method such as PVD, sputtering, LPCVD, ALD or electroless plating. A third insulating layer 312 is then formed on the conductive layer 310 and filled into the cup-shaped opening 306. The insulating layer 312 may comprise silicon dioxide ($SiO_2$), silicon nitride ($SiN_X$) or combinations thereof. A planarizing process such as chemical mechanical polishing (CMP) is performed to remove the excess conductive layer 310 and the insulating layer 312 to form a cup-shaped heating electrode 314. The conductive layer 310 may comprise metals, alloys, metal compounds, semiconductor materials or combinations thereof. The conductive layer 310 may comprise basic metals or alloys thereof (such as Cu or Al), refractory metals or alloys thereof (such as Co, Ta, Ni, Ti, W or TiW), transition metal nitrides, refractory metal nitrides (such as CoN, TaN, NiN, TiN or WN), nitride metal silicides (such as $CoSi_XN_Y$, $TaSi_XN_Y$, $NiSi_XN_Y$, $TiSi_XN_Y$ or $WSi_XN_Y$), metal silicides (such as Co-salicide ($CoSi_X$), Ta-salicide ($TaSi_X$), Ni-salicide ($NiSi_X$), Ti-salicide ($TiSi_X$), W-salicide ($WSi_X$), polycrystalline semiconductor materials, amorphous semiconductor materials, phase change materials (such as GaSb, GeTe, $Ge_2Sb_2Te_5$ or Ag—In—Sb—Te), conductive oxide materials (such as yttrium barium copper oxide (YBCO), $Cu_2O$, indium tin oxide (ITO)) or combinations thereof. The conductive layer 310 may have a thickness of about 1 nm to 300 nm. The cup-shaped heating electrode 314 is electrically connected to the first electrode layer 302 through the diode 308.

Figure 4B:
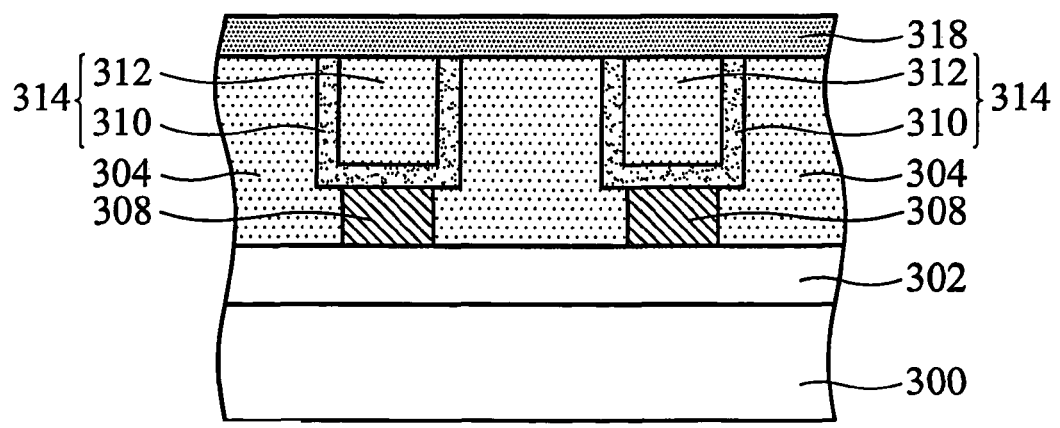
Figure 4C:
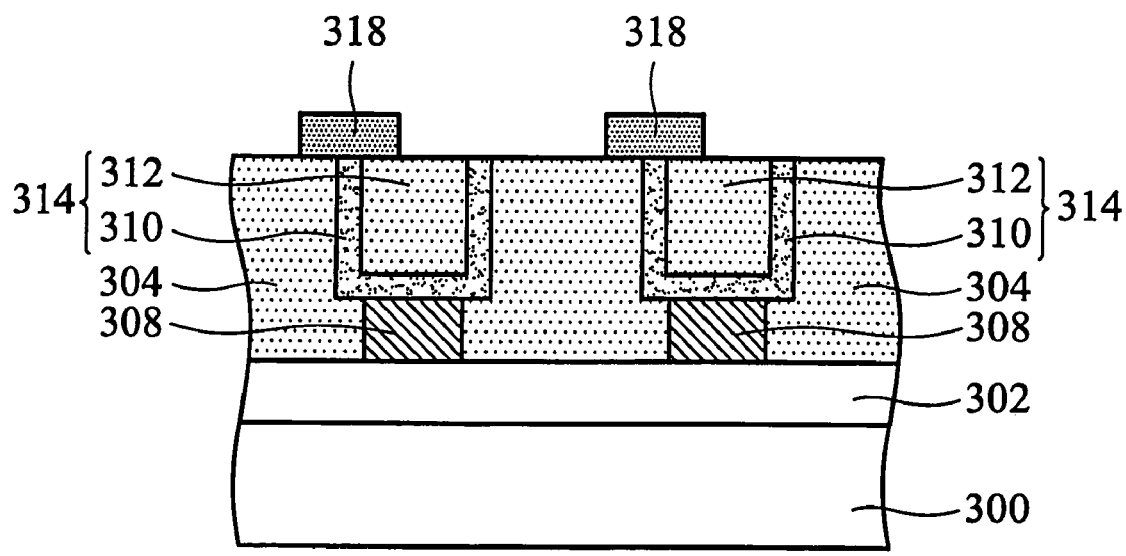
FIGS. 4c, 6c, 7c and 8c are cross sections taken along line B-B' of FIGS. 4a, 6a, 7a and 8a, respectively.
Figure 4D:
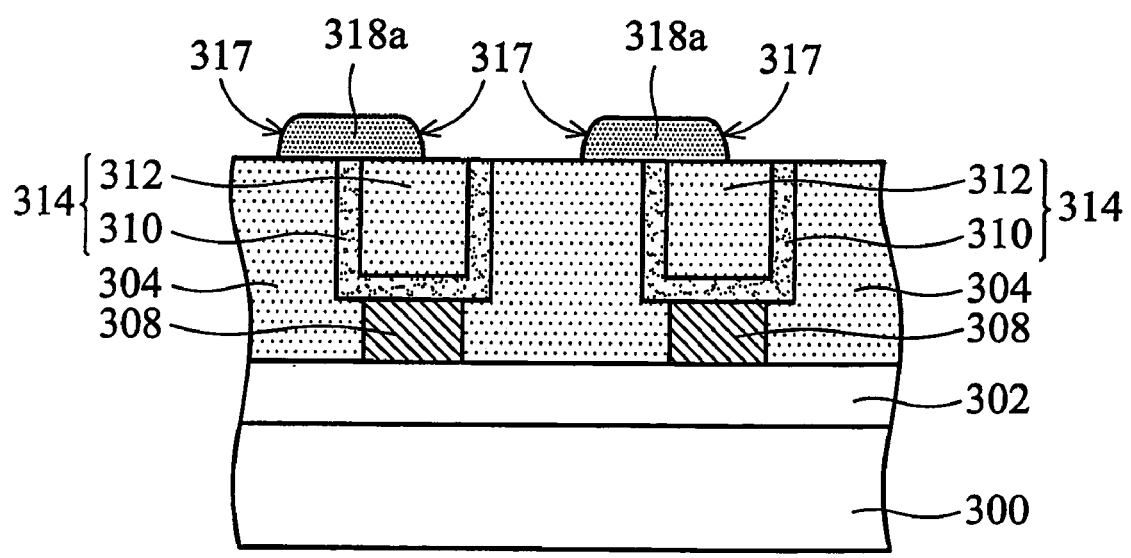
FIG. 4d shows a cross section taken along line B-B' of FIG. 4a showing another exemplary embodiment of a 2-dimensional phase change memory device.

FIGS. 4a, 4b and 4c illustrate a formation of a first insulating layer 318. An insulating layer such as silicon nitride ($SiN_X$) is blanketly formed on the first dielectric layer 304 and the cup-shaped heating electrode 314. Next, a patterned photoresist (not shown) is used to cover the insulating layer and to define the position of the first insulating layer 318. An anisotropic etching process is performed to remove the insulating layer not covered by the patterned photoresist. The patterned photoresist is then removed to form the strip-shaped first insulating layer 318. FIG. 4d illustrates a formation of another embodiment of a first insulating layer 318a. Subsequent to forming the first insulating layer 318, a cleaning process may be performed using, for example, an inductively coupled plasma-Ar (ICP-Ar) to form the rounded first insulating layer 318a. Although an isotropic etching such as dry or wet etching can be utilized to form the first insulating layer 318a. In one embodiment, the first insulating layer 318 or the first insulating layer 318a preferably has an etching selectivity of about 1 to 1000 with the first dielectric layer 304. The first insulating layer 318 or the first insulating layer 318a is formed on the first dielectric layer 304 along a first direction 316 and covers a portion of the cup-shaped heating electrode 314. Preferably, the first insulating layer 318 or the first insulating layer 318a with a thickness of about 60 nm covers one of two parallel edges of the cup-shaped heating electrode 314, for example, half of the cup-shaped heating electrode 314.

Figure 5A:
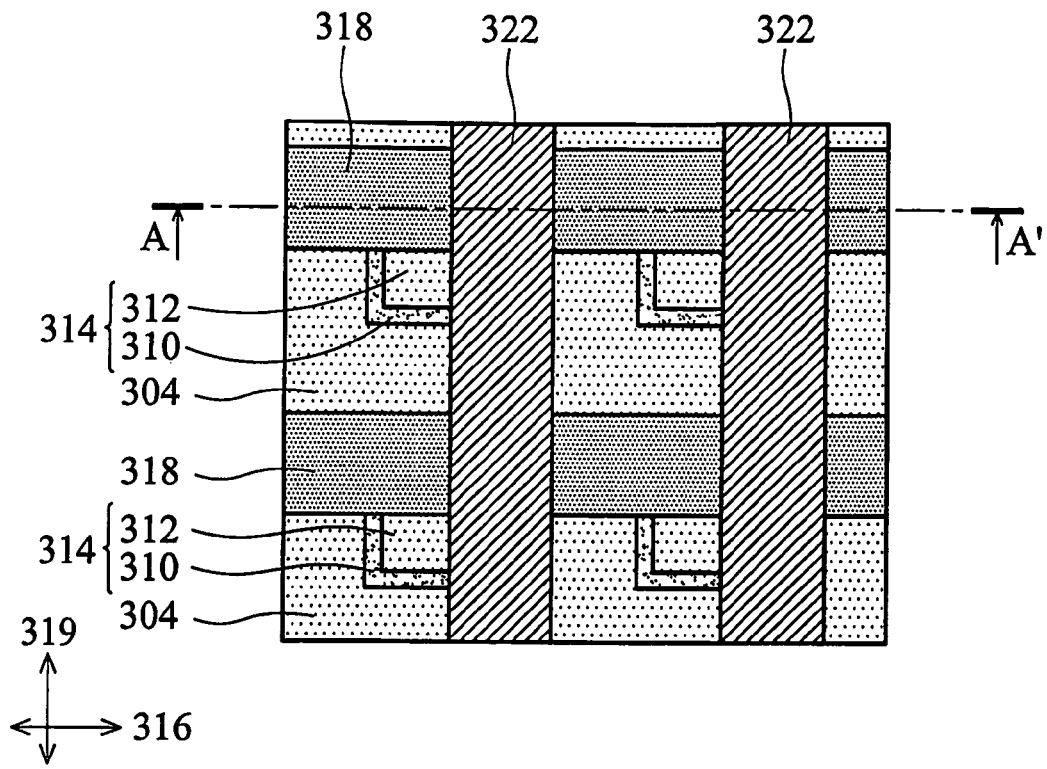
Figure 5B:
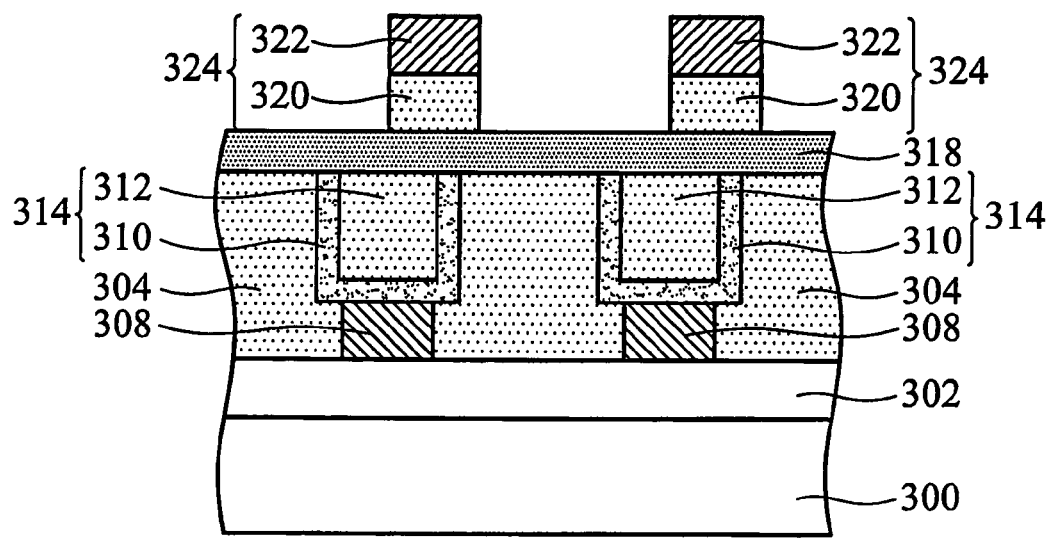

FIGS. 5a and 5b illustrate formation of a stacked structure 324. An insulating layer and a conductive layer are sequentially formed in the first dielectric layer 304 and the first insulating layer 318. The insulating layer may comprise silicon dioxide ($SiO_2$), silicon nitride ($SiN_X$) or combinations thereof. The conductive layer may comprise metals, alloys, metal compounds, semiconductor materials or combinations thereof. The conductive layer may comprise basic metals or alloys thereof (such as Cu or Al), refractory metals or alloys thereof (such as Co, Ta, Ni, Ti, W or TiW), transitional metal nitrides, refractory metal nitrides (such as CoN, TaN, NiN, TiN or WN), nitride metal silicides (such as $CoSi_XN_Y$, $TaSi_XN_Y$, $NiSi_XN_Y$, $TiSi_XN_Y$ or $WSi_XN_Y$), metal silicides (such as $CoSi_X$, $TaSi_X$, $NiSi_X$, $TiSi_X$ or $WSi_X$), polycrystalline semiconductor materials, amorphous semiconductor materials, phase change materials (such as GaSb, GeTe, $Ge_2Sb_2Te_5$ or Ag—In—Sb—Te), conductive oxide materials (such as yttrium barium copper oxide (YBCO), $Cu_2O$, indium tin oxide (ITO)) or combinations thereof. The conductive layer may be a single layer or a composite layer formed by the aforementioned materials with an arbitrary sequence or layer number. Next, a patterned photoresist (not shown) is used to cover the conductive layer for defining the position of the stacked structure 324. An anisotropic etching process is performed to remove the conductive layer and the insulating layer not covered by the patterned photoresist. The patterned photoresist is then removed to form the strip-shaped stacked structure 324. The stacked structure 324 comprises a fourth insulating layer 320 and a conductive layer 322 (serves as a top electrode layer 322) formed on the first dielectric layer 304 along a second direction 319. The stacked structure 324 also covers a portion of the cup-shaped heating electrode 314 and the first insulating layer 318. In one embodiment, the first direction 316 and the second direction 319 are perpendicular. Preferably, the stacked structure 324 covers one of two parallel edges along the second direction 319 of the cup-shaped heating electrode 314, for example, one quarter of the cup-shaped heating electrode 314. The fourth insulating layer 320 and the conductive layer 322 respectively have a preferable thickness of about 100 nm.

Figure 6A:
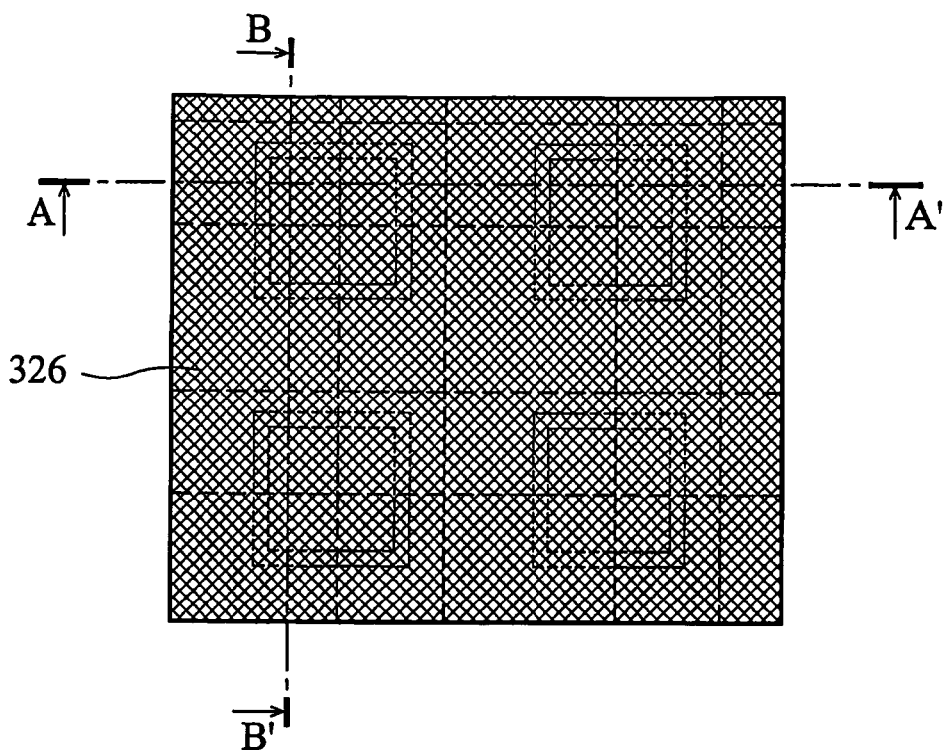
Figure 6B:
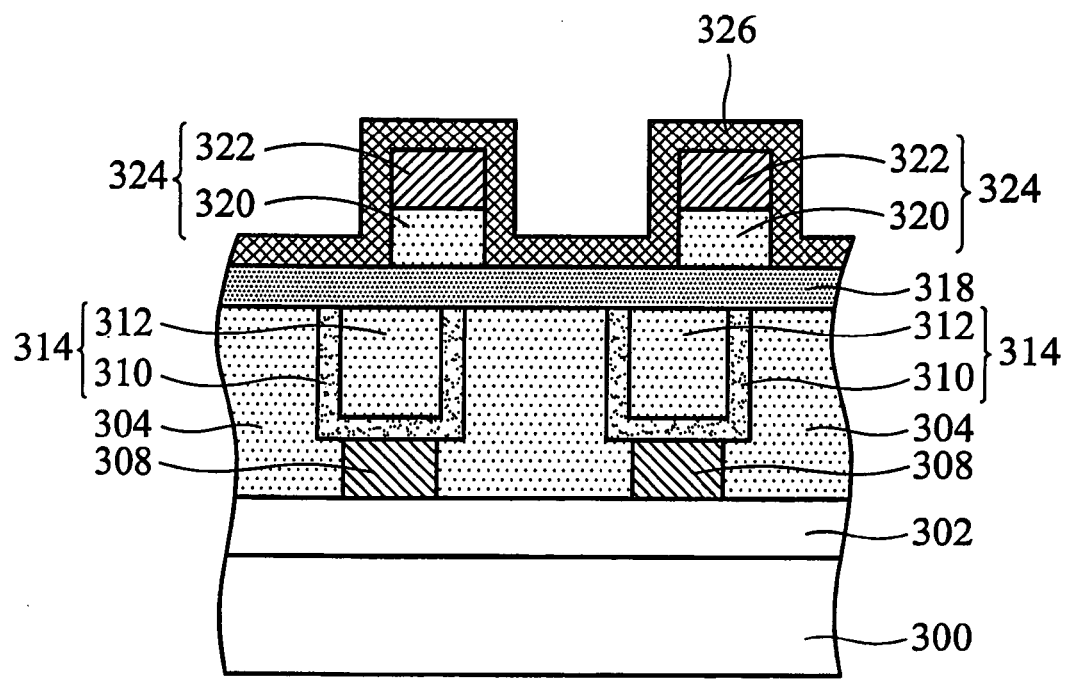
Figure 6C:
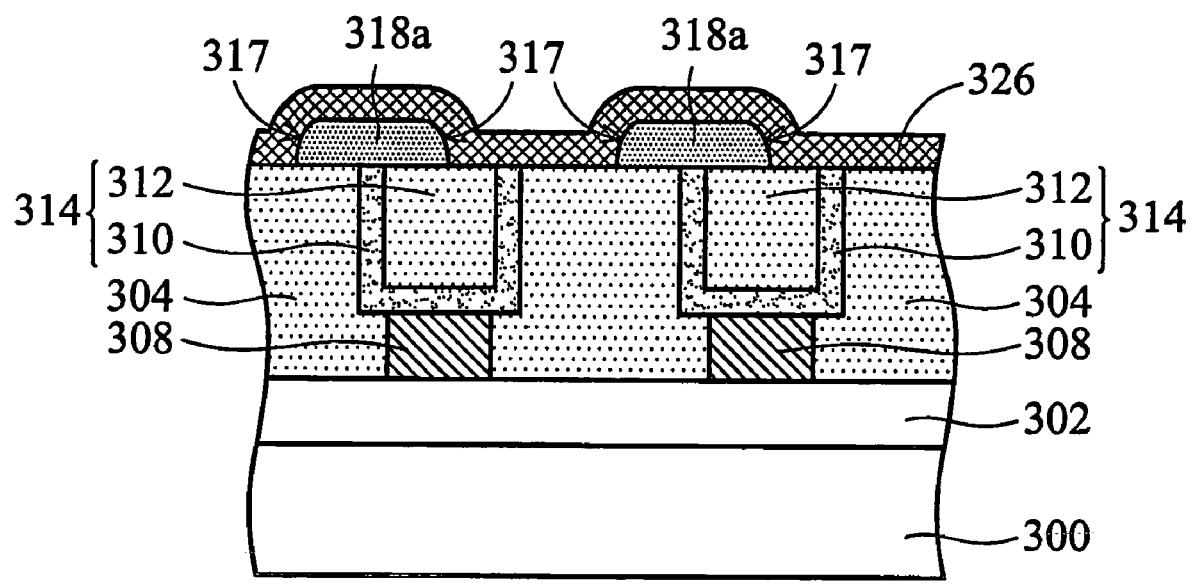

FIGS. 6a and 6b illustrate an embodiment of forming a phase change material layer 326. FIG. 6c shows another embodiment of a phase change material layer 326 formed on a rounded edge 317 of the first insulating layer 318a. The phase change material layer 326 is blanketly deposited over the entire region by physical vapor deposition (PVD), thermal evaporation, pulsed laser deposition or metal organic chemical vapor deposition (MOCVD). The phase change material 326 may comprise binary, ternary or tetra chalcogenide such as GaSb, GeTe, Ge—Sb—Te (GST) alloy, Ag—In—Sb—Te alloy or combination thereof. In some embodiments, the phase change material layer 326 preferably has a thickness of about 10 nm to 50 nm. The thickness of the phase change material layer 326 may be up to 100 nm if the cup-shaped opening 306 has a larger aperture as shown in FIGS. 2a and 2b to meet phase change memory requirements. An anisotropic etching is performed to form phase change material spacers 330 on sidewalls 328 of the stacked structures 324 as shown in FIGS. 7a, 7b, 7c and 7d. A first electrode structure 331a is thus formed. Referring to FIGS. 7e and 7f, the phase change material layer 326 on the rounded edge 317 of the first insulating layer 318a is completely removed after the anisotropic etching process. The first electrode structure 331a comprises the stacked structures 324 and the phase change material spacers 330. An intersecting area of the phase change material spacer 330 and the conductive layer 310 controls a contact area 380a between the phase change material spacer 330 and the conductive layer 310. Compared to the conventional process, the size of the contact area 380a is smaller and more precisely controlled.

FIGS. 8a, 8b, 8c and 8d, illustrate another embodiment in which an over-etching process is performed to remove a portion of the phase change material layer formed on sidewalls of the first insulating layer 318. Phase change material spacers 330a are thus formed on the sidewalls 328 of the stacked structures 324 with a height lower than a height of the stacked structures 324. A first electrode structure 331b is thus formed comprising the fourth insulating layer 320, the conductive layer 322 and the phase change material spacers 330a. An intersecting area of the phase change material spacer 330a and the conductive layer 310 controls the contact area 380b. Thus the heating electrode is smaller and more precisely controlled than a heating electrode formed by a conventional photolithography process.

As shown in FIG. 9, a second dielectric layer 332 is blanketly deposited covering the first electrode structure 331. The second dielectric layer 332 may comprise silicon dioxide ($SiO_2$), silicon nitride ($SiN_X$) or the like. A planarizing process such as chemical mechanical polishing (CMP) is then performed to remove the excess second dielectric layer 332 until the conductive layer 322 of the first electrode structure 331 is exposed. A first phase change memory structure 400a is thus completely formed. A second phase change memory structure 400b is then formed on the first phase change memory structure 400a by repeating the processes as shown in FIGS. 2a, 2b to 7a-7f. In this embodiment, the insulating layer 318 of the second phase change memory structure 400b and the insulating layer 318 of the first phase change memory structure 400a are perpendicular. The phase change material spacers 330a of the second phase change memory structure 400b are perpendicular to the phase change material spacers 330a of the first phase change memory structure 400a. The first exemplary embodiment of a phase change memory device 100a is thus completely formed. The phase change memory device 100a is a 3-dimensional (3D) memory array using the top electrode layer of the first phase change memory structure 400a as the bottom electrode layer of the second phase change memory structure 400b, and the number of the phase change memory devices is not limited.

One exemplary embodiment of the 3-dimensional phase change memory device 100a mainly comprises: a substrate 300; a first electrode layer 302 formed on the substrate 300; a first phase change memory structure 400a formed on the first electrode layer 302 and electrically connected to the first electrode layer 302; a second phase change memory structure 400b formed on the first phase change memory structure 400a and electrically connected to the first phase change memory structure 400a, wherein the first phase change memory structure 400a or the second phase change memory structure 400b comprises a cup-shaped heating electrode 314 disposed in a first dielectric layer 304; a first insulating layer 318 disposed on the first dielectric layer 304 along a first direction 316 and covering a portion of the cup-shaped heating electrode 314; a second dielectric layer 332 disposed on the first insulating layer 318 and the first dielectric layer 304; a first electrode structure 331 disposed in the second dielectric layer 332 along a second direction 319 and covering a portion of the first insulating layer 318 and the cup-shaped heating electrode 314, wherein the first electrode structure 331 comprises a pair of phase change material spacers 330a disposed on a pair of sidewalls 328 of the first electrode structure 331 and covering a portion of the cup-shaped heating electrode 314.

FIG. 10 is a cross section showing another exemplary embodiment of a 3-dimensional phase change memory device 100b. The differences between the 3-dimensional phase change memory device 100a and 100b are described in the following. As shown in FIG. 10, a second insulating layer 366 and a second electrode layer 368 are formed sequentially on the first phase change memory structure 400a. A second phase change memory structure 400b is then formed on the second electrode layer 368 by repeating the processes as shown in FIGS. 2a, 2b to 7a-7f. The second electrode layer 368 is electrically connected to the second phase change memory structure 400b. In this embodiment, the insulating layer 318 of the second phase change memory structure 400b and the insulating layer 318 of the first phase change memory structure 400a are parallel. The phase change material spacers 330a of the second phase change memory structure 400b are parallel to the phase change material spacers 330a of the first phase change memory structure 400a. The second exemplary embodiment of a phase change memory device 100b is thus completely formed. The phase change memory device 100b is a 3D memory array formed by stacking the second phase change memory structure 400b on the first phase change memory structure 400a, and the number of the phase change memory devices is not limited.

Some advantages of an exemplary embodiment of the 3D phase change memory device 100a and 100b are described in the following. The phase change memory device is a unit memory cell with multi-bits, referred to as a multi-level cell (MLC). The top electrode of the lower phase change memory structure is shared with the bottom electrode of the upper phase change memory structure, thus, process cycle time can be reduced. Lastly, by controlling the contact area between the phase change material spacer and the conductive layer via an intersecting area of the phase change material spacer and the conductive layer controls the contact area is minimized.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method of fabricating a phase change memory device, comprising:
   providing a substrate with a first electrode layer formed thereon;
   forming a first phase change memory structure on the first electrode layer and electrically connected to the first electrode layer;
   forming a second phase change memory structure on the first phase change memory structure and electrically connected to the first phase change memory structure, wherein the first phase change memory structure or the second phase change memory structure comprises:
   forming a cup-shaped heating electrode in a first dielectric layer;
   forming a first insulating layer on the first dielectric layer along a first direction parallel to a side of the cup-shaped heating electrode covering a portion of the cup-shaped heating electrode;
   forming a first electrode structure along a second direction parallel to another side of the cup-shaped heating electrode and covering a portion of the first insulating layer and the cup-shaped heating electrode, wherein the first electrode structure comprises a pair of phase change material spacers disposed on a pair of sidewalls of the first electrode structure covering a portion of the cup-shaped heating electrode, thereby forming an intersectional contact area between one of the phase change material spacers and the cup-shaped heating electrode; and
   forming a second dielectric layer on the first insulating layer and the first dielectric layer and adjacent the first electrode structure.

2. The method of fabricating the phase change memory device as claimed in claim 1, further comprising:
   forming a p-type semiconductor layer and an n-type semiconductor layer on the first electrode layer by thin film deposition;
   removing a portion of the p-type semiconductor layer and the n-type semiconductor to form a diode by photolithography and etching processes;
   forming a first dielectric layer on the first electrode layer and the diode with covering the diode before forming the cup-shaped heating electrode.

3. The method of fabricating the phase change memory device as claimed in claim 2, further comprising:
   removing a portion of the first dielectric layer until the diode is exposed forming a cup-shaped opening by photolithography and etching processes;
   forming a conductive layer in the cup-shaped opening, wherein the conductive layer is cup-shaped;
   forming a third insulating layer on the conductive layer, the third insulating layer filling the cup-shaped opening; and
   performing a planarized process to remove a portion of the conductive layer and the third insulation layer to form the cup-shaped heating electrode.

4. The method of fabricating the phase change memory device as claimed in claim 1, wherein the first insulating layer covers at least one edge of the cup-shaped heating electrode.

5. The method of fabricating the phase change memory device as claimed in claim 1, wherein the first insulating layer covers at least one edge of the cup-shaped heating electrode.

6. The method of fabricating the phase change memory device as claimed in claim 1, further comprising:
   forming a stacked structure comprising a fourth insulating layer and a conductive layer On the first dielectric layer;
   covering a phase change material layer on the stacked structure; and
   removing a portion of the phase change material layer by anisotropic etching to form a pair of phase change material spacers on a pair of sidewall of the stacked structure to form the first electrode structure.

* * * * *